United States Patent
Chastain et al.

(12) 
(10) Patent No.: US 6,384,325 B1
(45) Date of Patent: May 7, 2002

(54) VENTILATION PORT AND EMI WAVE-GUIDE FOR ELECTRONIC EQUIPMENT

(75) Inventors: David M Chastain, Richardson; Farrukh S. Syed; Eric C. Peterson, both of McKinney, all of TX (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/586,184

(22) Filed: Jun. 1, 2000

(51) Int. Cl.[7] .................................................. H05K 9/00
(52) U.S. Cl. ........................ 174/35 R; 454/184; 361/602
(58) Field of Search ........................... 174/35 R, 35 MS; 361/816, 818, 692; 454/184

(56) References Cited

U.S. PATENT DOCUMENTS 6,211,458 B1 * 4/2001 Mitchell et al. .......... 174/35 R

* cited by examiner

*Primary Examiner*—Dean A. Reichard
*Assistant Examiner*—Hung V Ngo

(57) ABSTRACT

A system for ventilating electronic equipment and suppressing the radiation of electromagnetic interference (EMI) from the electronic equipment. More particularly, the present invention relates to a ventilation port and EMI wave-guide. There is provided corrugated spring member is compressed between a first plate and a second plate so as to define a plurality of ducts, each having a depth and a cross-sectional width. The spring member is in electrical contact with the first plate and the second plate.

18 Claims, 11 Drawing Sheets

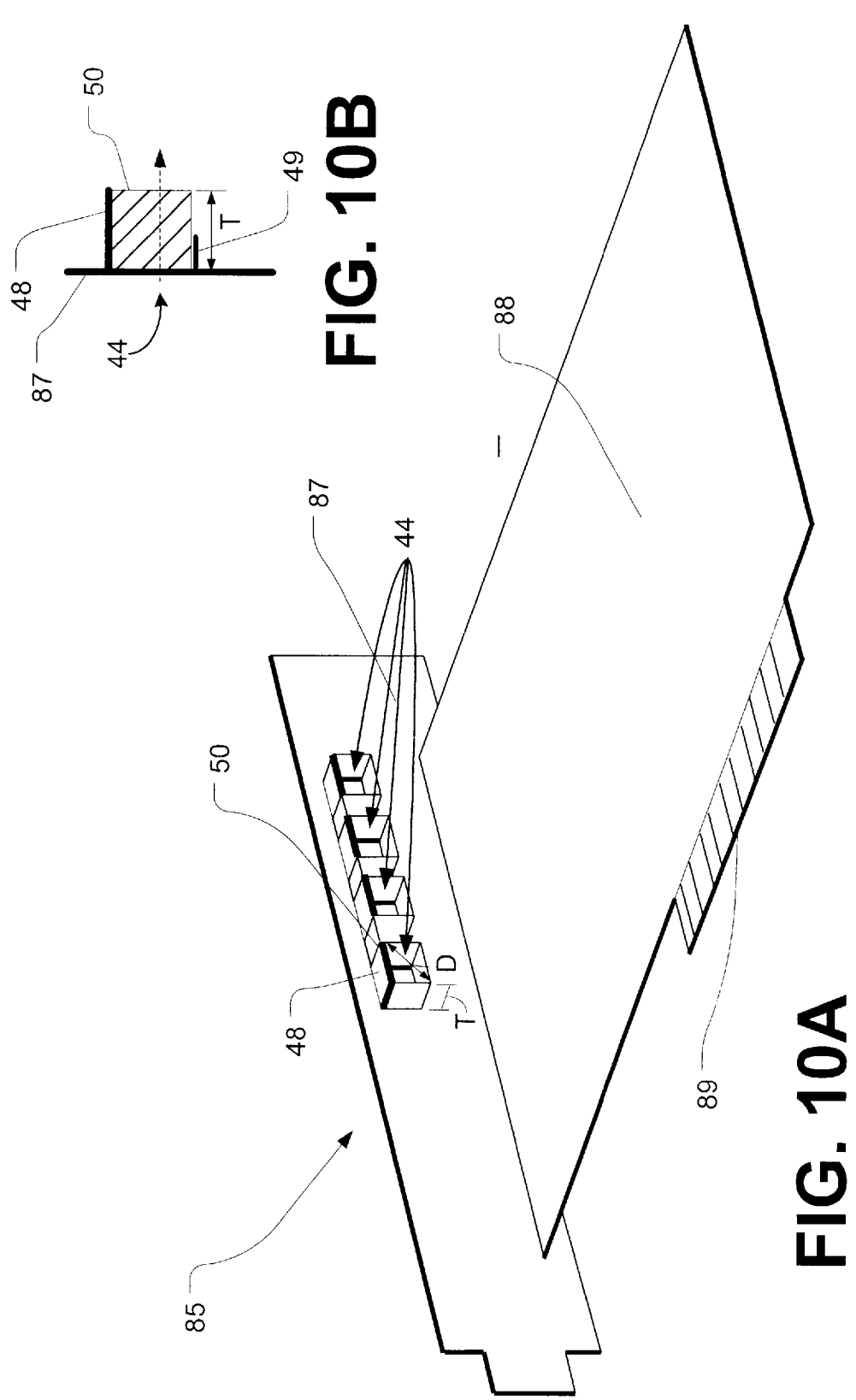

VENTILATION PORT AND EMI WAVE-GUIDE FOR ELECTRONIC EQUIPMENT

TECHNICAL FIELD

The present invention is generally related to a ventilation port and wave-guide for suppressing electromagnetic radiation generated by an electronic component and, more particularly, is related to a system for air cooling of electronic components within an enclosure via ports. The ports are constructed to provide for attenuation of high frequency EMI radiation through the ports.

BACKGROUND OF THE INVENTION

In electronic equipment it is typically necessary to provide for cooling/ventilation of the electronic components during operation. Typical ventilation techniques incorporate air holes (ventilation ports) in the case or housing of the piece of electronic equipment to allow air flow to circulate through the case to cool the electronic components. An example of a typical configuration for cooling electronic components of a piece of electronic equipment 3 is shown in FIG. 1. FIG. 1 shows a case 5, having a fan 6 for inducing airflow "A" through a series of holes 10, punched through the cabinet 5 to provide for cooling of components in the case 5.

In electronic equipment which incorporate electronic devices having high operating frequencies, electromagnetic interference (EMI) is often generated by the high frequency electronic devices. This EMI can escape from the housing containing the electronic devices via typical ventilation ports 10 (FIG. 1). At high frequencies of operation, it is difficult to simultaneously provide for both cooling and EMI/ESD (electrostatic discharge) attenuation in an electronic equipment by simply providing for air holes (ventilation ports) in, for example, a cabinet 5 of the electronic equipment as is shown in FIG. 1. Further, electrostatic discharge generated from external sources can radiate via the ventilation ports 10 into the case 5. In short, while punching air holes in the sheet metal cabinet might provide for sufficient airflow A to properly cool an electronic device, such air holes typically are insufficient to provide for an appropriate level of attenuation of EMI and ESD radiation.

Certain properties of electromagnetic wave propagation allow for a "hole" in a sheet metal cabinet to provide for sufficient attenuation of electromagnetic wave propagation where the hole has sufficient depth. More particularly, where the depth of the hole is at least 50% or more of the maximum cross section length (diagonal), the "hole" will provide substantially greater attenuation of electromagnetic wave radiation than would be provided based simply upon the size of the hole alone. Wave-guide EMI filters have been developed in accordance with these properties. However, these wave-guide filters have typically required multiple parts and processing steps, including soldering of wave-guide components in order to obtain electrical conductivity. Thus, the cost of production of such a wave-guide is significant. These costs make the use of these types of wave-guides cost effective only for more expensive equipment or computer systems, such as mainframe computers. For smaller, less expensive electronic equipment assemblies such as individual input/output (I/O) modules including industry standard VersaModule Eurocard (VME), Compact Peripheral Component Interconnect (CPCI), and Peripheral Component Interconnect (PCI) modules, the cost of these types of wave-guides make them unfeasible. As the operational frequencies of electronic equipment, such as I/O modules, is increasing with frequencies of 2.5 GHz–10.0 GHz becoming common, a cost-effective wave-guide solution will be needed.

In order to attenuate the level of EMI radiated from a piece of electronic equipment, it has been common to provide for metal wave-guide structures to be used in place of typical ventilation ports or filtration screens. One example of a wave-guide structure of this type is illustrated in FIG. 2. FIG. 2 illustrates an electronic component 3 having a case 5 that incorporates a typical wave-guide filter structure 20 (filter structure 20). This filter structure 20 is further illustrated in FIG. 3A and FIG. 3B.

With reference to FIG. 3A and FIG. 3B, it can be seen that filter structure 20 is constructed of multiple individual hexagonal wave-guide tubes (ducts) 21 which are attached to each other via, for example, a solder joint or weld. The hexagonal wave tubes 21 are then attached to front and back plates 22a and 22b, respectively, to form the filter structure 20. Filter structure 20 is used as an air inlet port for a case 5 as illustrated in FIG. 2.

With reference to FIG. 3B, if the individual hexagonal wave-guide tubes 21 are constructed for a depth T which is at least 50% or more of the maximum cross-section length D of the wave-guide tube 21, then the wave-guide tube 21 will also function as an EMI filter and thus function to attenuate the radiation of any EMI radiation via the wave-guide tubes 21. The filter structure 20 is a labor intensive structure to construct and is, thus, expensive and not suitable for less costly equipment applications in which profit margins are narrow.

Thus, a heretofore unaddressed need exists in the industry to address the aforementioned deficiencies and inadequacies.

SUMMARY OF THE INVENTION

The present invention provides a system for ventilating electronic equipment and suppressing the radiation of electromagnetic interference (EMI) from the electronic equipment. More particularly, the present invention relates to a ventilation port and EMI wave-guide. Briefly described, in architecture, the system can be implemented as follows. A corrugated spring member is inserted (under tension) between a first plate and a second plate so as to establish electrical contact, as well as define a plurality of ducts, each having a depth and a cross-sectional width.

Other systems, methods, features, and advantages of the present invention will be or become apparent to one with skill in the art upon examination of the following drawings and detailed descriptions. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 10A and FIG. 10B illustrate a printed circuit card in accordance with the present invention.

DETAILED DESCRIPTION OF THE PREFERRED EMBODIMENT

Figure 1:
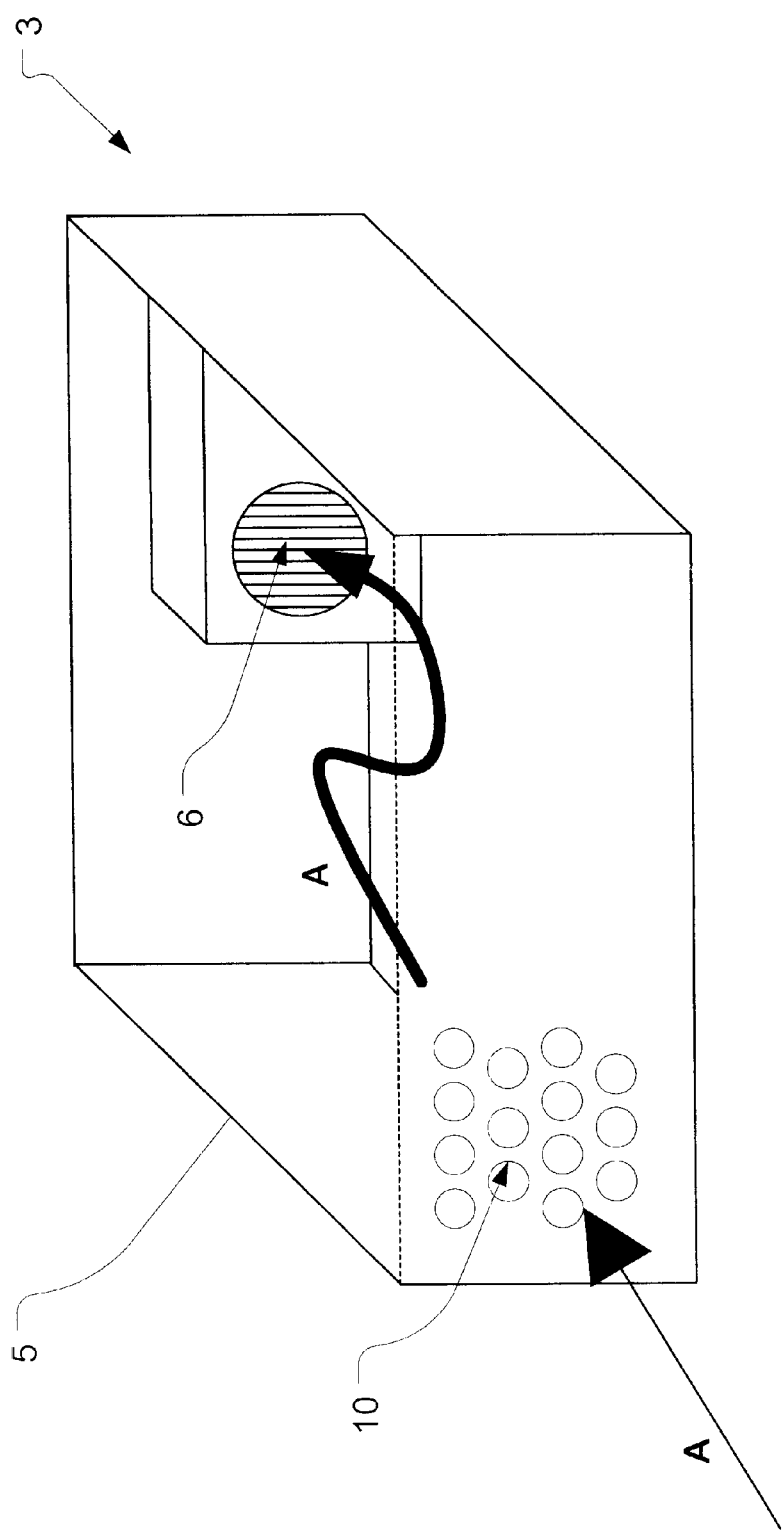
FIG. 1 is a an illustration of a piece of electronic equipment having ventilation ports for cooling.
Figure 2:
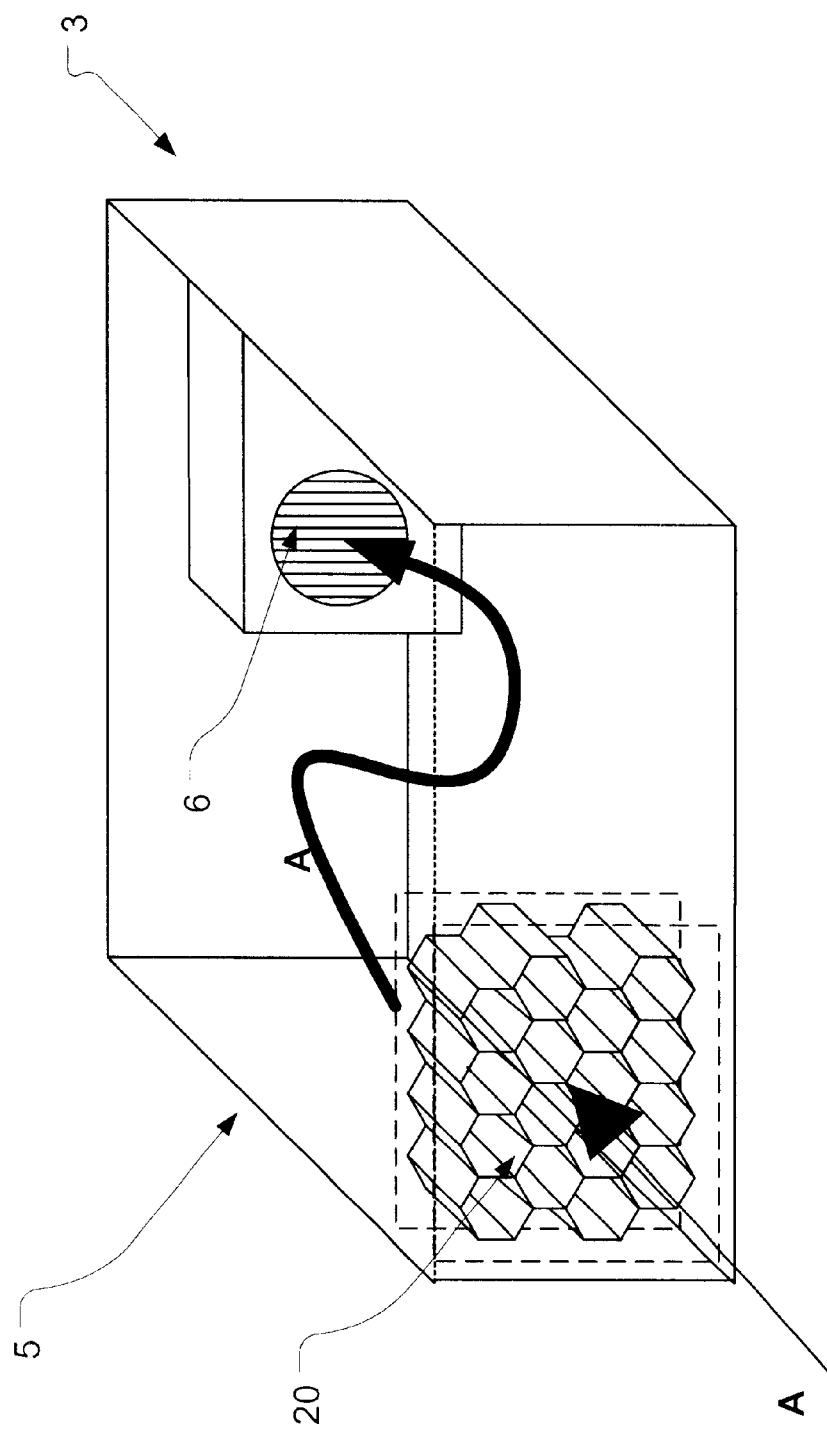
FIG. 2 is a diagram illustrating a wave-guide and ventilation port according to the prior art.
Figures 3A, 3B:
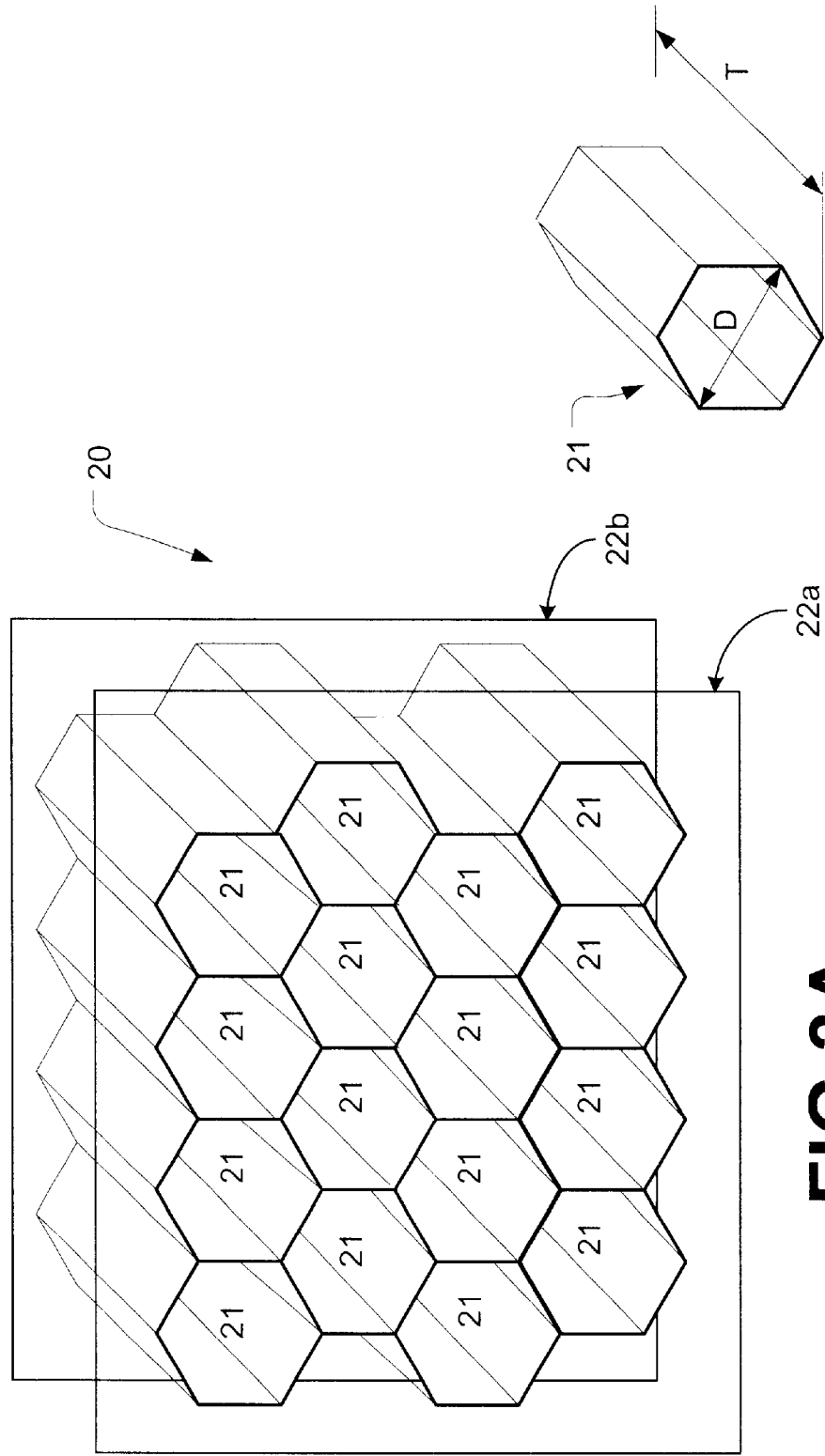
FIG. 3A and FIG. 3B are detailed illustrations of a wave-guide according to the prior art.
Figure 4:
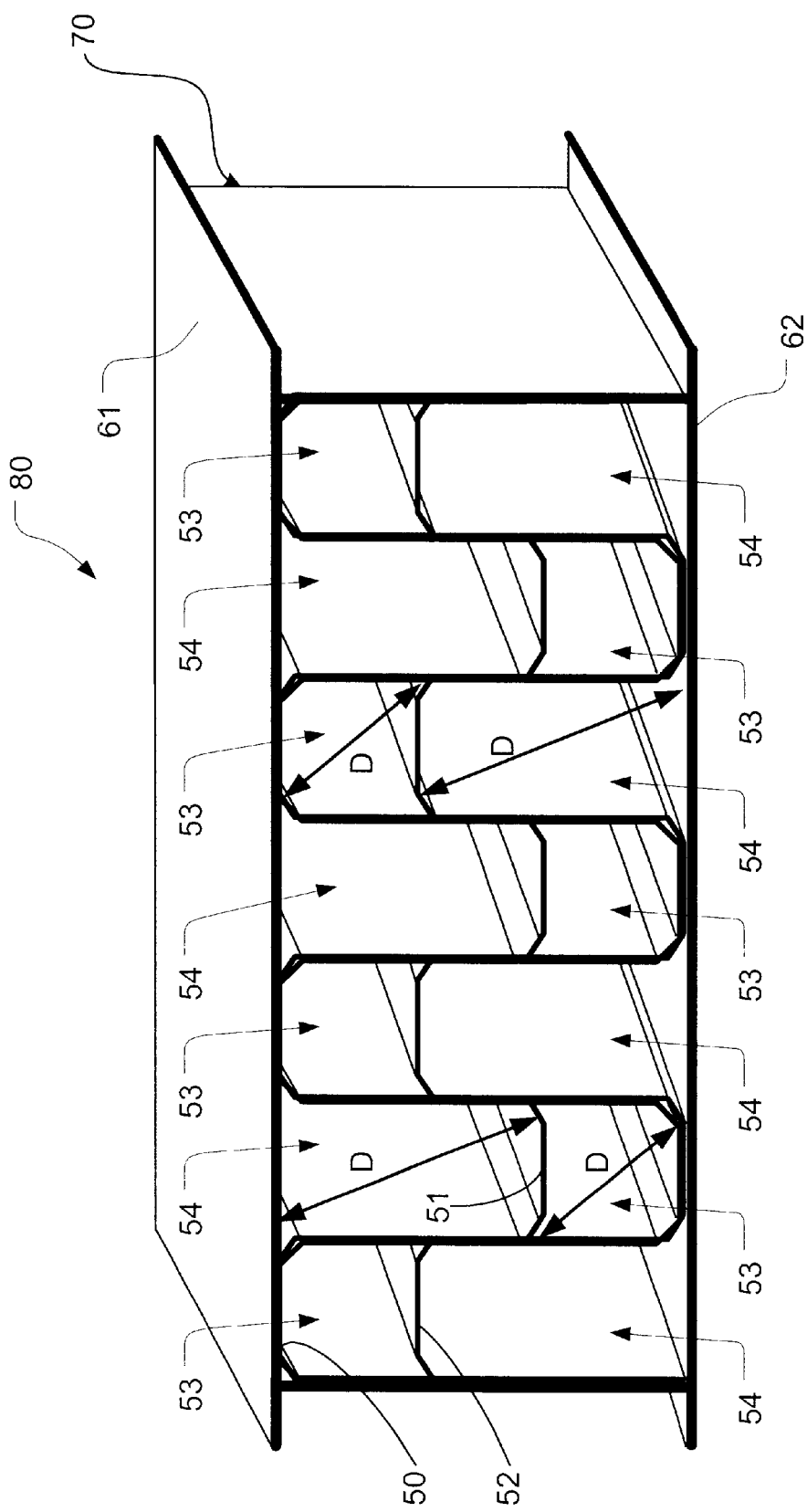
FIG. 4 is a diagram illustrating an embodiment of a ventilation port and EMI seal wave.

With reference to FIG. 4, an embodiment of a ventilation port and EMI seal wave-guide 80 according to present invention is shown. A nested structure 70 is provided. Nested structure 70 is compressed between a plate 61 and a plate 62 so as to make an electrically conductive contact with the plate 61 and the plate 62. The nested structure 70 is made up of spring members 50, 51 and 52 (see also FIG. 6), which are nested, or fit together, so as to form a series of ducts 53 and compressed between plates 61 and 62 to further form (enclose) ducts 54. Each of the ducts 53 and 54, preferably have a depth T which is 50% or greater than the longest maximum cross section (diagonal) D of the ducts 53 and 54.

Figure 5:
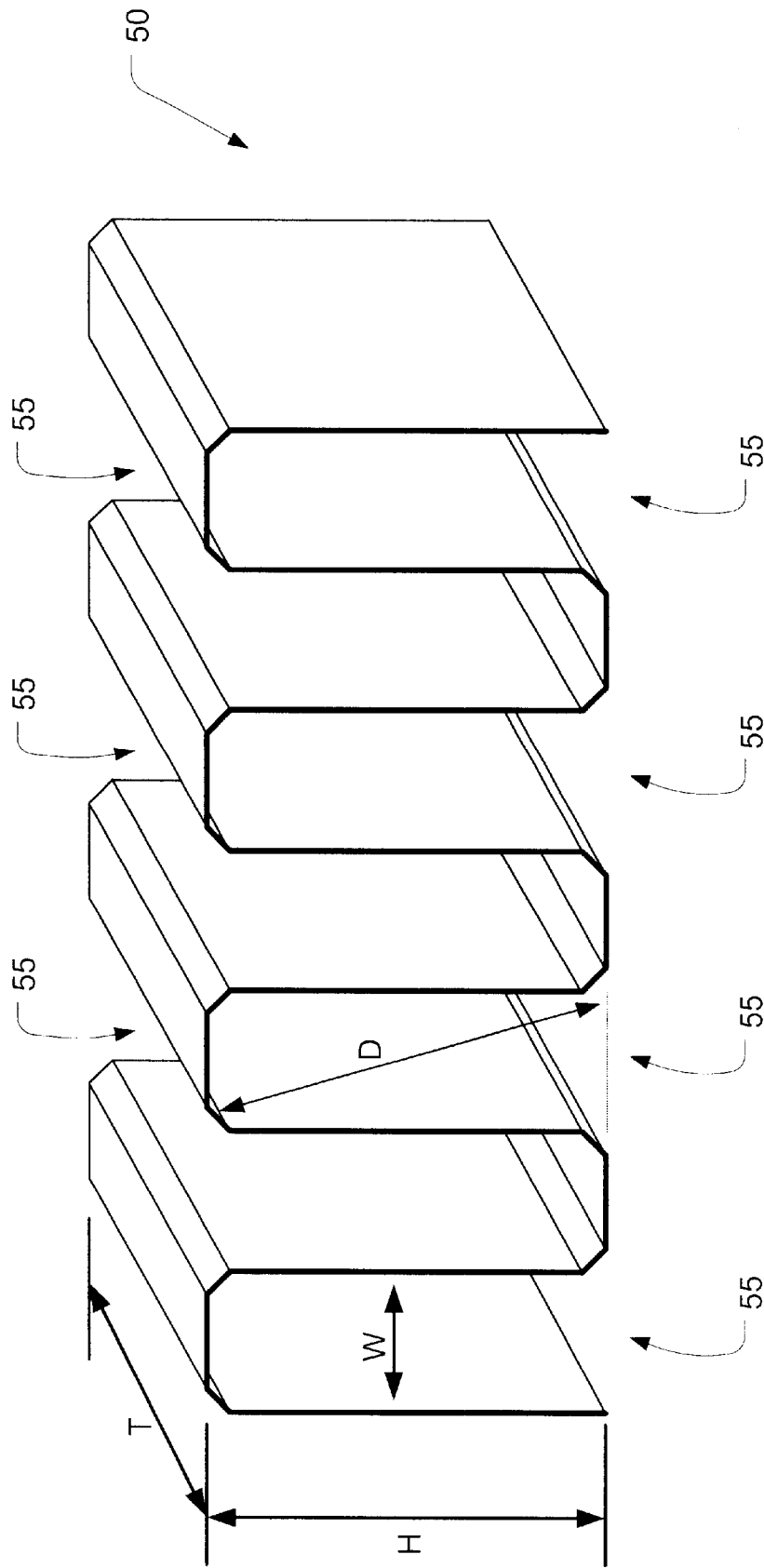
FIG. 5 is a diagram illustrating a spring member 50.

In FIG. 5 a spring member 50 is shown. Spring member 50 is preferably a corrugated metal sheet formed to provide a series of alternate troughs 55. Each of troughs 55 has a width W, height H and depth T and are characterized by an open end. In an embodiment of the present invention in which only a single spring member is utilized, as opposed to the nested arrangement of two or more springs as shown in FIG. 4, the depth T of spring member 50 is preferably 50% or greater than the diagonal D in order to provide for cut-off of EMI radiation.

Figure 6:
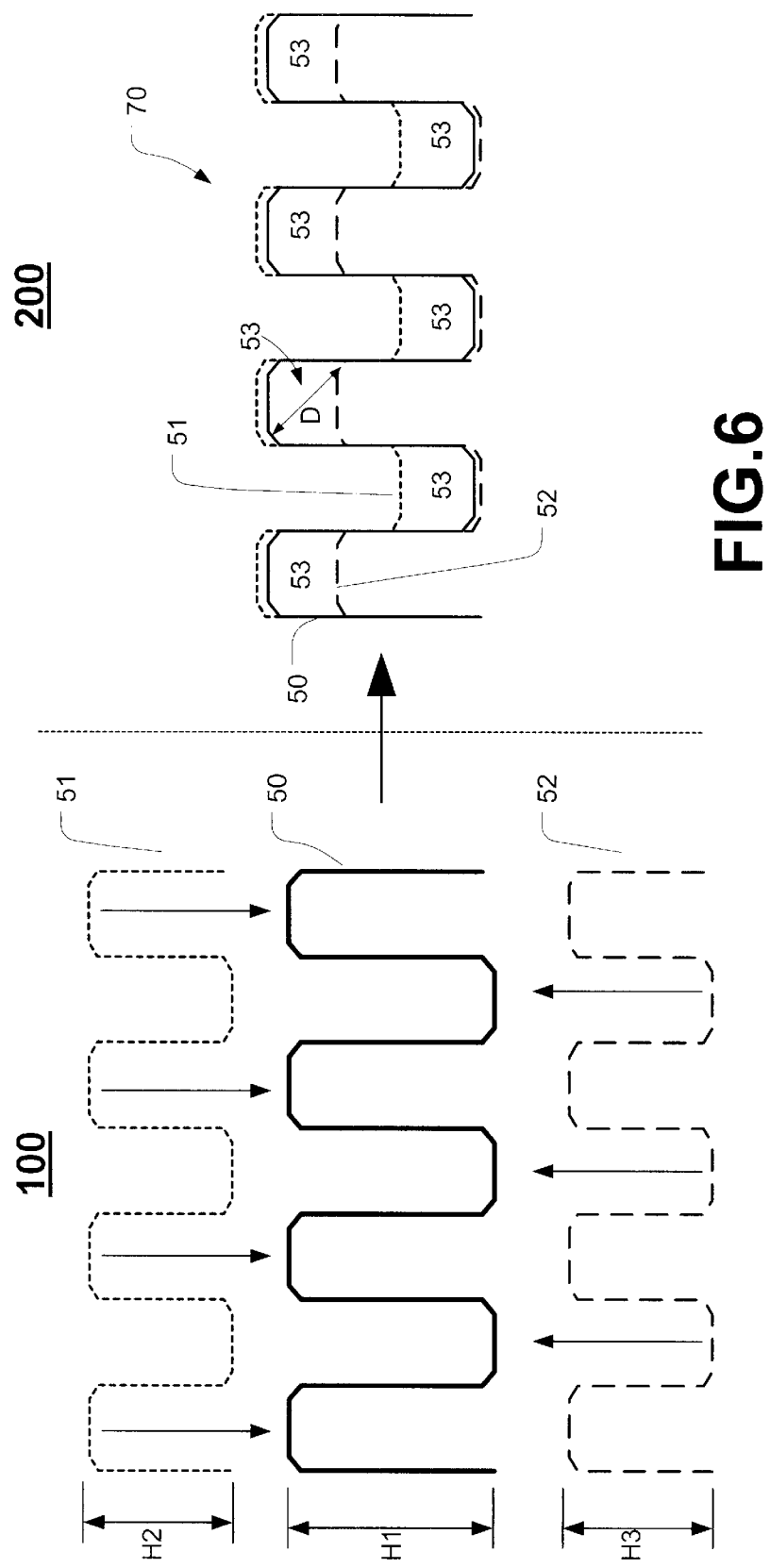
FIG. 6 is a diagram illustrating nesting of spring members.

In FIG. 6, spring members 50, 51 and 52 are shown to illustrate how multiple spring members may be nested together to form a nested structure 70 which provides for multiple ducts 53. At 100 in FIG. 6, it can be seen that each of the spring members 50, 51 and 52 have a height H1, H2 and H3, respectively. Further, the depth T of each spring member 50, 51 and 52 is preferably equal (FIG. 5). In order to achieve a desired cross sectional length (diagonal) D of duct 53, the height H1, H2 and H3 of corrugated sheet members 52 and 51, respectively, can be adjusted. In a preferred embodiment, the height H2 and H3 of spring members 51 and 52, respectively, is less than the height H1 of the main spring member 50. When spring members 51 and 52 are fit/nested with spring member 50, ducts 53 are formed. Ducts 53 have a depth equal to the depth T of the longest spring member, for example 50 (FIG. 4 and FIG. 5). It will be noted that spring members 50, 51 and 52, as well as plates 61 and 62 noted above, may be made of any number of metals, including, but not limited to, for example, beryllium copper or stainless steel.

Figure 7:
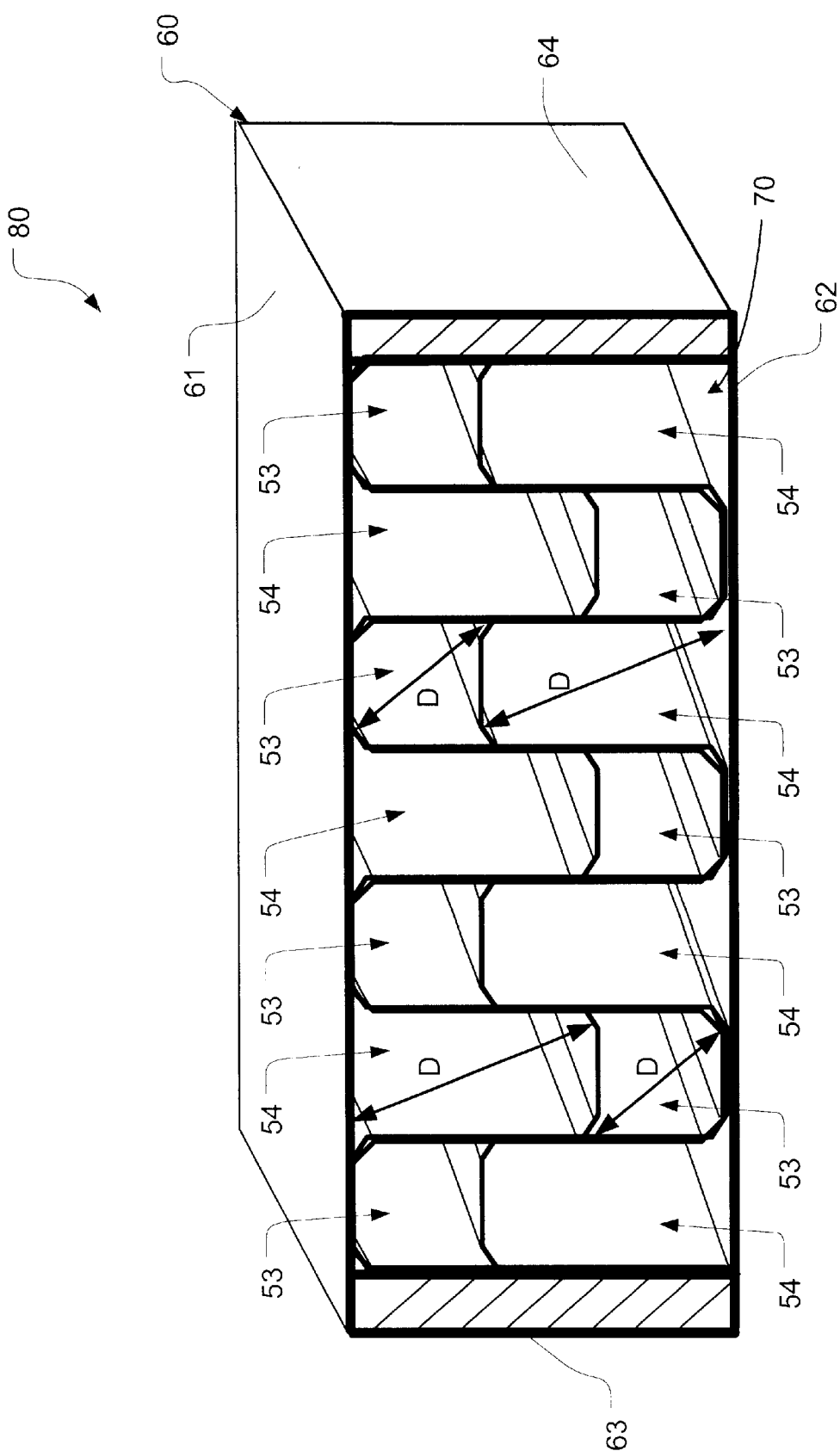
FIG. 7 is a diagram illustrating an alternate embodiment of the present invention.
Figure 8:
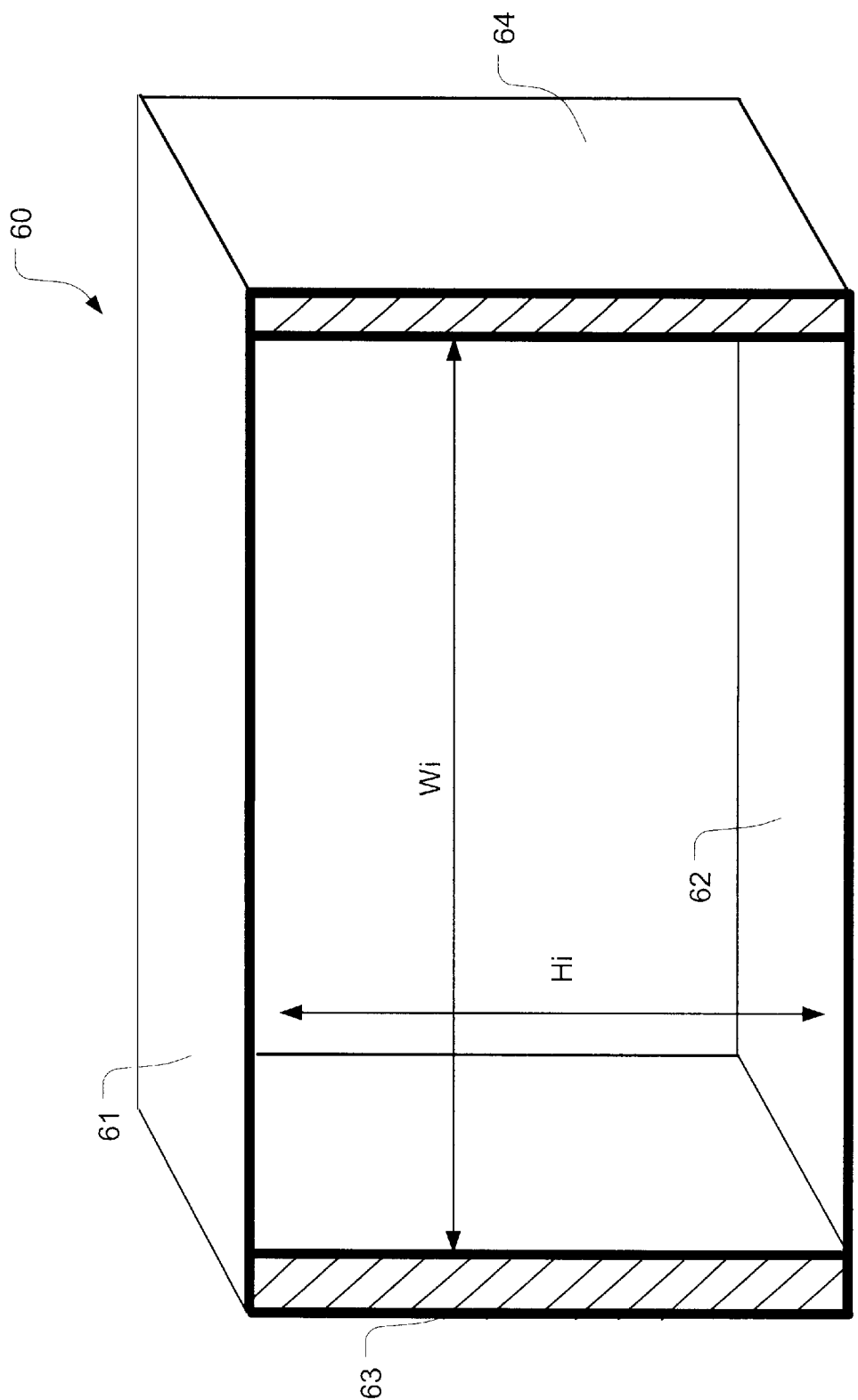
FIG. 8 is a diagram illustrating a box-like structure 60 of the alternate embodiment shown in FIG. 7.

With reference to FIG. 7 and FIG. 8, an alternate embodiment of the ventilation port and EMI seal wave-guide 80 is shown. In FIG. 7, nested structure 70 is inserted into a box-like structure 60 and provides for ducts 53 and 54. In FIG. 8, it can be seen that box 60 includes an upper surface plate 61, lower surface plate 62 and alternate side plates 63 and 64. The interior of box 60 has a height Hi and a width Wi. Box 60 is constructed to accommodate the overall width, height and depth of the nested structure 70.

Figure 9:
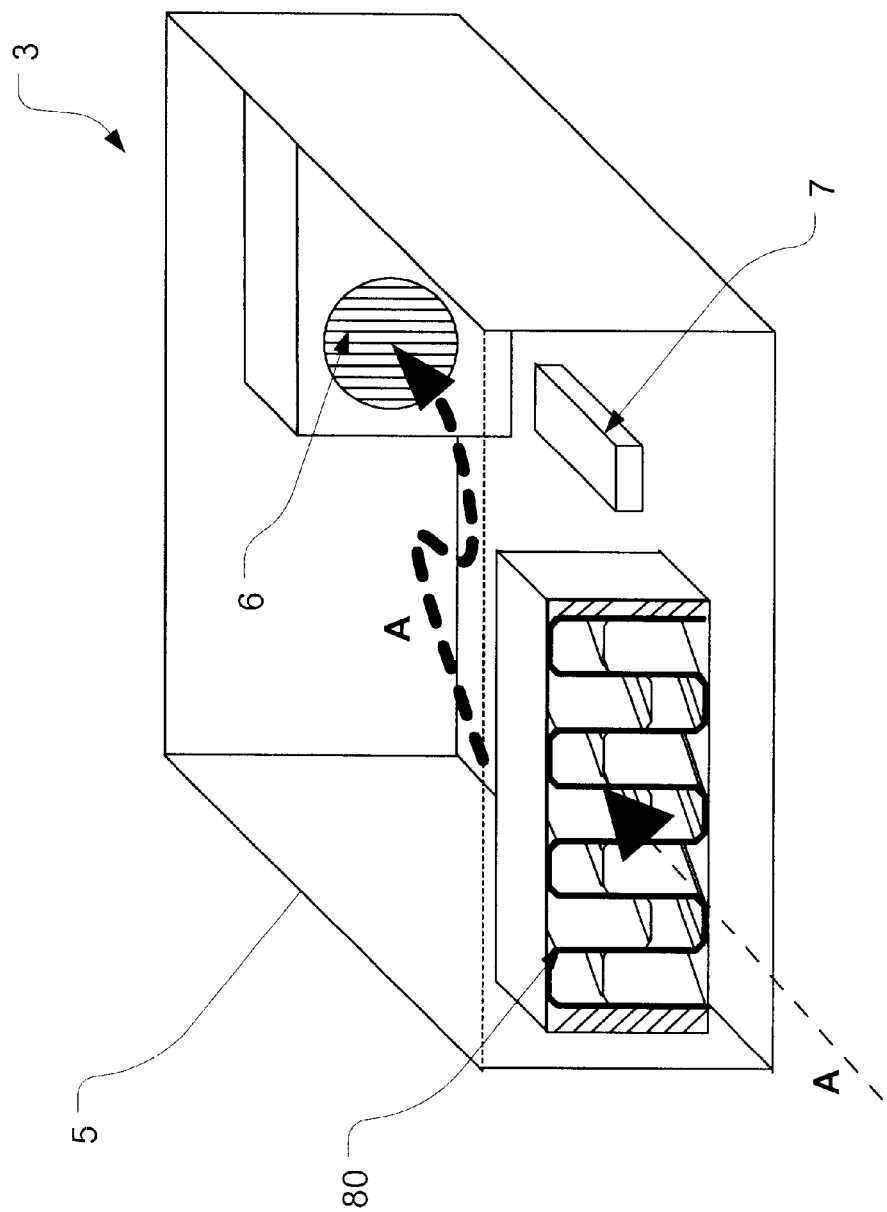
FIG. 9 is a diagram illustrating an embodiment of the present invention.

In FIG. 9, an electronic component 3 having a case 5 is shown in which the ventilation port and EMI wave-guide 80 is incorporated to provide for ventilation and EMI attenuation. Airflow A is shown flowing through the ventilation port into the case 5 and out of the case 5 via fan 6. Case 5 may contain an electronic device 7. Electronic device 7 may be for example, an integrated circuit, such as a microprocessor, or other semiconductor device. Electronic device 7 is cooled/ventilated via the airflow A through case 5 and fan 6.

FIG. 10A and FIG. 10B illustrate an alternate embodiment of the present invention in which a spring member 50 is incorporated as a part of a printed circuit (PC) card 85 which includes a printed circuit board 88 having electrical edge connector 89. More particularly, spring member 50 is connected to a spine 87 and aligned with openings formed in spine 87 via punch out tabs (flaps) 48. Spring member 50 aligns with the openings to form ducts 44. Ducts 44 have a depth T which is preferably 50% or greater than the diagonal D of the duct 44. Spring member 50 is supported in place under tension on spine 87 via a support tab 49. PC card 85 may be, for example, an Infiniband™ compliant I/O module, or a VME, CPCI, or PCI compliant I/O module.

Figure 11A:
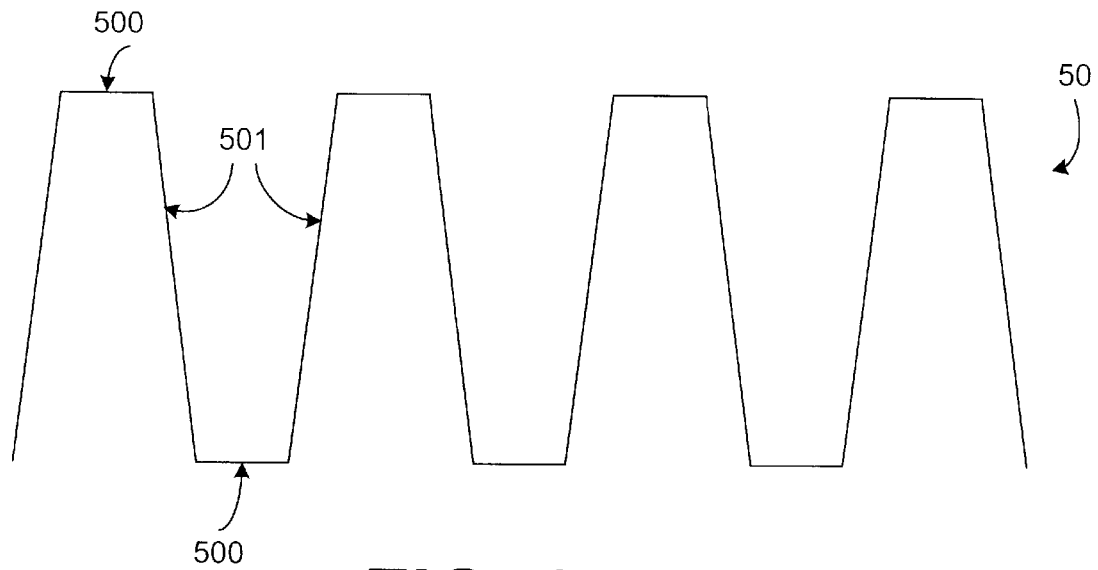
FIG. 11A and FIG. 11B illustrate examples of alternate corrugation patterns which can be used to form spring member 50.
Figure 11B:
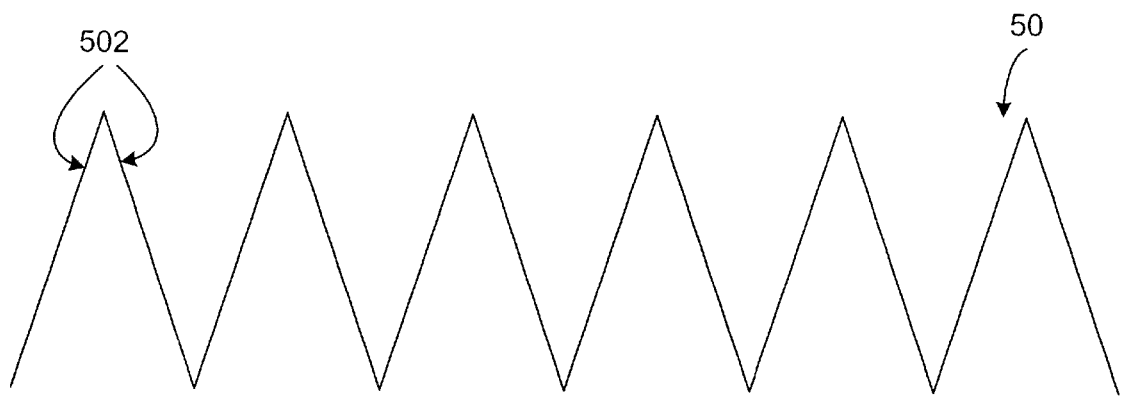

It will be recognized by those skilled in the art that the corrugated sheet member 50 can be fashioned to provide for a number of corrugated patterns other than those depicted in FIG. 4 through FIG. 9. With reference to FIG. 11A and FIG. 11B, it can be seen that spring member 50 can be fashioned to provide for sizes 502 configured to form a generally saw-tooth pattern as shown in FIG. 11B. Further, spring member 50 can be fashioned to provide for a generally clipped saw-tooth pattern as shown in FIG. I IA, in which the pinnacle of each saw-tooth is clipped to form a substantially flat surface 500 with angled sides 501.

It should be emphasized that the above-described embodiments of the present invention, particularly, any "preferred" embodiments, are merely possible examples of implementations, merely sot forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed:

1. An electronic component, comprising:
   an enclosure;
   a ventilation and wave-guide electromagnetic interference (EMI) seal assembly for providing airflow to ventilate said electronic component and attenuate high frequency electromagnetic radiation outside said enclosure, said high frequency electromagnetic radiation being generated by an electronic device housed within said enclosure;
   said ventilation and wave-guide EMI seal assembly comprises: a nested structure comprising a first corrugated metal sheet and a second corrugated metal sheet;
   a retaining structure for retaining said nested structure in a predetermined position;

said first corrugated metal sheet is characterized by a plurality of primary troughs, each of said primary troughs having a height H1, a depth T1 and an open end; said second corrugated metal sheet is characterized by a plurality of secondary troughs, each of said secondary troughs having a height H2, a depth T2 and an open end, said secondary corrugated metal sheet is configured so that the height of said secondary troughs H2 is less than the height H1 of said primary troughs;

said second corrugated metal sheet is arranged with said first corrugated metal sheet so that at least one of said plurality of primary troughs of said first corrugated metal sheet receives said second corrugated metal sheet through said open end, thereby forming a first duct having a diagonal cross section D1; and said retaining structure is configured to receive said nested structure so as to enclose at least one of said plurality of secondary troughs and thereby form a second duct having a diagonal cross section D2, and to enclose at least one of said plurality of primary troughs thereby forming a third duct having a diagonal cross section D3.

2. The electronic component of claim 1, wherein said retaining structure comprises:

a first plate in contact with said nested structure so as to form said second duct; and a second plate in contact with said nested structure so as to form said third duct.

3. The electronic component of claim 2, wherein said retaining structure is configured so that said second plate is parallel to said first plate and is connected to said first plate by a first side plate and a second side plate; and said nested structure is held in contact with said first side plate and said second side plate by compressional forces exerted by said first and second corrugated metal sheets.

4. The electronic component of claim 2, wherein said diagonal cross sections D1, D2 and D3 are each at least two times greater than the greater of said depths T1 and T2.

5. The electronic component of claim 4, further comprising an electronic device housed within said enclosure.

6. The electronic component of claim 5, wherein said enclosure comprises a mounting spine attached to a printed circuit card.

7. The electronic component of claim 6, wherein said electronic device is attached to said printed circuit card.

8. The electronic component of claim 7, wherein said printed circuit card comprises an Infiniband™ compliant printed circuit card.

9. A method of constructing an electronic enclosure having a ventilation and wave-guide EMI seal assembly, said method comprising the steps of:

fabricating a first corrugated metal sheet characterized by a plurality of primary troughs, each of said primary troughs having a height H1, a depth T1 and an open end, fabricating a second corrugated metal sheet characterized by a plurality of secondary troughs, each of said secondary troughs having a height H2, a depth T2 and an open end, said height H2 of said secondary troughs is less than the height H1 of said primary troughs, configuring said first corrugated metal sheet and said second corrugated metal sheet so that at least one of said plurality of primary troughs of said first corrugated metal sheet receives said second corrugated metal sheet through a said open end, thereby forming a first duct having a diagonal cross section D1, configuring a retaining structure comprising a first plate and a second plate parallel to said first plate;

placing said nested structure in contact with said first plate and said second plate so as to enclose at least one of said plurality of secondary troughs and thereby form a second duct having a diagonal cross section D2, and to enclose at least one of said plurality of primary troughs thereby forming a third duct having a diagonal cross section D3.

10. The method of claim 9, further comprising the step of attaching said retaining structure to said electronic enclosure to provide airflow to ventilate said enclosure via said first, second and third ducts and to attenuate high frequency electromagnetic radiation outside said enclosure.

11. The method of claim 10, further comprising the step of fabricating a third corrugated metal sheet characterized by a plurality of tertiary troughs, each of said tertiary troughs having a height H3, a depth T3 and an open end; and configuring said third corrugated metal sheet, said first corrugated metal sheet and said second corrugated metal sheet so that at least one of said plurality of primary troughs of said first corrugated metal sheet receives said third corrugated metal sheet through a said open end, thereby forming a fourth duct having a diagonal cross section D4.

12. A ventilation and wave-guide EMI seal assembly comprising:

a nested structure comprising a first corrugated metal sheet and a second corrugated metal sheet;

a retaining structure for retaining said nested structure in a predetermined position;

said first corrugated metal sheet is characterized by a plurality of primary troughs, each of said primary troughs having a height H1, a depth T1 and an open end; said second corrugated metal sheet is characterized by a plurality of secondary troughs, each of said secondary troughs having a height H2, a depth T2 and an open end, said secondary corrugated metal sheet is configured so that the height of said secondary troughs H2 is less than the height H1 of said primary troughs;

said second corrugated metal sheet is arranged with said first corrugated metal sheet so that at least one of said plurality of primary troughs of said first corrugated metal sheet receives said second corrugated metal sheet through a said open end, thereby forming a first duct having a diagonal cross section D1; and said retaining structure is configured to receive said nested structure so as to enclose at least one of said plurality of secondary troughs and thereby form a second duct having a diagonal cross section D2, and to enclose at least one of said plurality of primary troughs thereby forming a third duct having a diagonal cross section D3.

13. A ventilation and wave-guide EMI seal assembly according to claim 12, further comprising a third corrugated metal sheet characterized by a plurality of tertiary troughs, each of said tertiary troughs having a height H3, a depth T3 and an open end;

said third corrugated metal sheet is arranged with said first corrugated metal sheet and said second corrugated metal sheet so that at least one of said plurality of primary troughs of said first corrugated metal sheet receives said third corrugated metal sheet through a said open end, thereby forming a fourth duct having a diagonal cross section D4.

14. A ventilation and wave-guide EMI seal assembly according to claim 12, wherein said retaining structure comprises:
   a first plate in contact with said corrugated metal sheet so as to form said second duct;
   a second plate in contact with said corrugated metal sheet so as to form said third duct;
   said second plate is parallel to said first plate and is connected to said first plate by a first side plate and a second side plate; and
   said nested structure is held in contact with said first side plate and said second side plate by compressional forces exerted by said first and second corrugated metal sheets.

15. A ventilation and wave-guide EMI seal assembly according to claim 14, wherein said diagonal cross sections D1, D2 and D3 are each at least two times greater than the greater of said depths T1 and T2.

16. A ventilation and wave-guide EMI seal assembly according to claim 14, wherein said first and second corrugated metals sheets each comprise a beryllium copper spring.

17. A method of fabricating a ventilation wave-guide EMI seal assembly, comprising the steps of:
   fabricating a first corrugated metal sheet characterized by a plurality of primary troughs, each of said primary troughs having a height H1, a depth T1 and an open end,
   fabricating a second corrugated metal sheet characterized by a plurality of secondary troughs, each of said secondary troughs having a height H2, a depth T2 and an open end, said height H2 of said secondary troughs is less than the height H1 of said primary troughs,
   configuring said first corrugated metal sheet and said second corrugated metal sheet so that at least one of said plurality of primary troughs of said first corrugated metal sheet receives said second corrugated metal sheet through a said open end, thereby forming a first duct having a diagonal cross section D1,
   configuring a retaining structure comprising a first plate and a second plate parallel to said first plate;
   placing said nested structure in contact with said first plate and said second plate so as to enclose at least one of said plurality of secondary troughs and thereby form a second duct having a diagonal cross section D2, and to enclose at least one of said plurality of primary troughs thereby forming a third duct having a diagonal cross section D3.

18. The method of claim 17, further comprising the step of fabricating a third corrugated metal sheet characterized by a plurality of tertiary troughs, each of said tertiary troughs having a height H3, a depth T3 and an open end; and
   configuring said third corrugated metal sheet, said first corrugated metal sheet and said second corrugated metal sheet so that at least one of said plurality of primary troughs of said first corrugated metal sheet receives said third corrugated metal sheet through a said open end, thereby forming a fourth duct having a diagonal cross section D4.

* * * * *